United States Patent
Mehregany

(10) Patent No.: US 7,892,876 B2
(45) Date of Patent: Feb. 22, 2011

(54) THREE-AXIS ACCELEROMETERS AND FABRICATION METHODS

(75) Inventor: Mehran Mehregany, Pepper Pike, OH (US)

(73) Assignee: Qualtre, Inc., Marlborough, MA (US)

(*) Notice: Subject to any disclaimer, the term of this patent is extended or adjusted under 35 U.S.C. 154(b) by 33 days.

(21) Appl. No.: 12/503,382

(22) Filed: Jul. 15, 2009

(65) Prior Publication Data
US 2009/0280594 A1 Nov. 12, 2009

Related U.S. Application Data

(62) Division of application No. 11/431,168, filed on May 10, 2006, now Pat. No. 7,578,189.

(51) Int. Cl.
*H01L 21/00* (2006.01)
*H01L 21/56* (2006.01)

(52) U.S. Cl. .................................. 438/51; 73/514.18

(58) Field of Classification Search . 73/514.17–514.32; 438/50–54; 257/E31.118, E51.02
See application file for complete search history.

(56) References Cited

U.S. PATENT DOCUMENTS

| | | | |
|---|---|---|---|
| 4,414,848 | A | 11/1983 | Shutt |
| 4,719,538 | A | 1/1988 | Cox |
| 4,789,803 | A | 12/1988 | Jacobsen et al. |
| 4,836,034 | A | 6/1989 | Izumi et al. |
| 4,851,080 | A | 7/1989 | Howe et al. |
| 4,882,933 | A | 11/1989 | Petersen et al. |
| 4,891,985 | A | 1/1990 | Glenn |
| 4,905,523 | A | 3/1990 | Okada |
| 4,941,354 | A | 7/1990 | Russell et al. |
| 4,967,605 | A | 11/1990 | Okada |
| 4,969,366 | A | 11/1990 | Okada |
| 5,014,415 | A | 5/1991 | Okada |

(Continued)

OTHER PUBLICATIONS

Jono, et al., "Electrostatuc servo system for multi-axis accelerometers," *IEEE*, 1994.

(Continued)

*Primary Examiner*—Calvin Lee
(74) *Attorney, Agent, or Firm*—Burns & Levinson LLP; Bruce D. Jobse, Esq.

(57) ABSTRACT

Disclosed are MEMS accelerometers and methods for fabricating same. An exemplary accelerometer comprises a substrate, and a proof mass that is a portion of the substrate and which is separated from the substrate surrounding it by a gap. An electrically-conductive anchor is coupled to the proof mass, and a plurality of electrically-conductive suspension anus that are separated from the proof mass extend from the anchor and are coupled to the substrate surrounding the proof mass. A plurality of sense and actuation electrodes are separated from the proof mass by gaps and are coupled to processing electronics. Capacitive sensing is used to derive electrical signals caused by forces exerted on the proof mass, and the electrical signals are processed by the processing electronics to produce x-, y- and z-direction acceleration data. Electrostatic actuation is used to induce movements of the mass for force balance operation, or self-test and self-calibration. The fabrication methods use deep reactive ion etch bulk micromachining and surface micromachining to form the proof mass, suspension arms and electrodes. The anchor, suspension arms and electrodes are made in the same process steps from the same electrically conductive material, which is different from the substrate material.

10 Claims, 4 Drawing Sheets

U.S. PATENT DOCUMENTS

| | | |
|---|---|---|
| 5,034,148 A | 7/1991 | Black |
| 5,051,643 A | 9/1991 | Dworsky et al. |
| 5,060,504 A | 10/1991 | White et al. |
| 5,092,645 A | 3/1992 | Okada |
| 5,103,667 A | 4/1992 | Allen et al. |
| 5,124,879 A | 6/1992 | Goto |
| 5,134,883 A | 8/1992 | Shannon |
| 5,164,328 A * | 11/1992 | Dunn et al. ............... 438/51 |
| 5,182,515 A | 1/1993 | Okada |
| 5,243,861 A | 9/1993 | Kloeck et al. |
| 5,253,510 A | 10/1993 | Allen et al. |
| 5,263,375 A | 11/1993 | Okada |
| 5,295,386 A | 3/1994 | Okada |
| 5,317,922 A | 6/1994 | Bomback et al. |
| 5,343,765 A | 9/1994 | Okada |
| 5,392,658 A | 2/1995 | Okada |
| 5,406,848 A | 4/1995 | Okada |
| 5,421,213 A | 6/1995 | Okada |
| 5,428,996 A | 7/1995 | Abbink et al. |
| 5,437,196 A | 8/1995 | Okada |
| 5,447,051 A | 9/1995 | Hanks et al. |
| 5,457,993 A | 10/1995 | Sapuppo |
| 5,485,749 A | 1/1996 | Nohara et al. |
| 5,487,305 A | 1/1996 | Ristic et al. |
| 5,492,020 A | 2/1996 | Okada |
| 5,497,668 A | 3/1996 | Okada |
| 5,531,002 A | 7/1996 | Okada |
| 5,531,092 A | 7/1996 | Okada |
| 5,567,880 A | 10/1996 | Yokota et al. |
| 5,571,972 A | 11/1996 | Okada |
| 5,639,973 A | 6/1997 | Okada |
| 5,646,346 A | 7/1997 | Okada |
| 5,661,235 A | 8/1997 | Bonin |
| 5,675,086 A | 10/1997 | Kihara et al. |
| 5,682,000 A | 10/1997 | Okada |
| 5,725,785 A | 3/1998 | Ishida et al. |
| 5,744,718 A | 4/1998 | Okada |
| 5,780,749 A | 7/1998 | Okada |
| 5,786,997 A | 7/1998 | Hoyt et al. |
| 5,811,693 A | 9/1998 | Okada |
| 5,831,163 A | 11/1998 | Okada |
| 5,856,620 A | 1/1999 | Okada |
| 5,877,421 A | 3/1999 | Biebl et al. |
| 5,889,242 A | 3/1999 | Ishihara et al. |
| 5,962,787 A | 10/1999 | Okada et al. |
| 5,987,985 A | 11/1999 | Okada |
| 6,053,057 A | 4/2000 | Okada |
| 6,122,965 A | 9/2000 | Seidel et al. |
| 6,158,291 A | 12/2000 | Okada |
| 6,159,761 A | 12/2000 | Okada |
| 6,167,757 B1 * | 1/2001 | Yazdi et al. ............... 73/514.32 |
| 6,185,814 B1 | 2/2001 | Okada |
| 6,271,830 B1 | 8/2001 | Berstis |
| 6,282,956 B1 | 9/2001 | Okada |
| 6,307,298 B1 | 10/2001 | O'Brien |
| 6,314,823 B1 | 11/2001 | Okada |
| 6,344,618 B1 | 2/2002 | Sato |
| 6,378,381 B1 | 4/2002 | Okada et al. |
| 6,401,536 B1 | 6/2002 | O'Brien |
| 6,437,772 B1 | 8/2002 | Zimmerman et al. |
| 6,474,133 B1 | 11/2002 | Okada |
| 6,477,903 B2 | 11/2002 | Okada |
| 6,512,364 B1 | 1/2003 | Okada |
| 6,683,358 B1 | 1/2004 | Ishida et al. |
| 6,716,253 B2 | 4/2004 | Okada |
| 6,739,189 B2 | 5/2004 | Lee et al. |
| 6,772,632 B2 | 8/2004 | Okada |
| 6,779,408 B2 | 8/2004 | Okada |
| 6,864,677 B1 | 3/2005 | Okada |
| 6,865,943 B2 | 3/2005 | Okada |
| 6,894,482 B2 | 5/2005 | Okada |
| 6,897,854 B2 | 5/2005 | Cho et al. |
| 6,913,941 B2 | 7/2005 | O'Brien et al. |
| 6,920,788 B2 | 7/2005 | Okada |
| 6,936,492 B2 | 8/2005 | McNeil et al. |
| 6,938,484 B2 | 9/2005 | Najafi et al. |
| 6,941,810 B2 | 9/2005 | Okada |
| 7,059,188 B2 | 6/2006 | Okada |
| 7,152,485 B2 | 12/2006 | Okada |
| 7,231,802 B2 | 6/2007 | Okada |
| 7,318,349 B2 | 1/2008 | Vaganov et al. |
| 7,360,455 B2 | 4/2008 | Okada |
| 7,363,814 B2 | 4/2008 | Okada |
| 7,367,232 B2 | 5/2008 | Vaganov et al. |
| 7,578,189 B1 * | 8/2009 | Mehregany ............... 73/514.18 |
| 2002/0014126 A1 | 2/2002 | Okada |
| 2002/0020689 A1 | 2/2002 | Leung |
| 2002/0040602 A1 | 4/2002 | Okada |
| 2002/0104378 A1 | 8/2002 | Stewart |
| 2003/0209075 A1 | 11/2003 | Okada |
| 2004/0187578 A1 | 9/2004 | Malametz et al. |
| 2004/0189340 A1 | 9/2004 | Okada |
| 2004/0231420 A1 | 11/2004 | Xie et al. |
| 2005/0109108 A1 | 5/2005 | Chen et al. |
| 2005/0132803 A1 * | 6/2005 | Baldwin et al. .......... 73/514.32 |
| 2005/0140356 A1 | 6/2005 | Inglese et al. |
| 2005/0160814 A1 | 7/2005 | Vaganov et al. |
| 2006/0272413 A1 | 12/2006 | Vaganov et al. |
| 2007/0012109 A1 | 1/2007 | Okada |
| 2007/0256469 A1 | 11/2007 | Okada |

OTHER PUBLICATIONS

Mineta, et al., "Three-axis capacitive accelerometer with uniform axial sensitivities," *J. Micromech. Microeng.*, vol. 6, (1996) pp. 431-435.

Puers, et al., "Design and processing experiments of a new miniaturized capacitive triaxial accelerometer," *Sensors and Actuators*, A 68 (1998), pp. 324-328.

Watanabe, et al., "Five-axis motion sensor with electrostatic drive and capacitive detection fabricated by silicon bulk micromachining," *Sensors and Actuators*, A 97-98 (2002).

Hitachi Metals, Ltd. "Piezoresistive-Type Triaxial Accelerating Sensor" http://hitachi-metals.co.jp/e/prod/prod14/p14_03.html.

Allen, Henry V., et al. "Self-Testable Accelerometer Systems" IEEE IC Sensors, pp. 113-115 (1989).

Jono, Keiji et al. "An Electrostatic Servo-Type Three-Axis Silicon Accelerometer" Meas. Sci. Technol. 6 (1995) 11-15.

Mizuno, Jun et al. "Silicon Bulk Micromachines Accelerometer with Simultaneous Linear and Angular Sensitivity" Transducers '97, 1997 Interantional Conference on Solid-State Sensors and Actuators, pp. 1197-1200.

Lemkin, Mark A. et al. "A 3-Axis Force Balanced Accelerometer Using a Single Proof-Mass" Transducers '97, 1997 Interantional Conference on Solid-State Sensors and Actuators, pp. 1185-1188.

Okada, K. "Tri-Axial Piezoelectric Accelerometer" Transducers '95, The 8th International Conference on Solid-State Sensors and Actuators, Jun. 25-29, 1995, pp. 566-569.

Takao, Hidekuni, et al. "Three Dimensional Vector Accelerometer Using SOI Structure for High Temperature" Transducers '95, The 8th International Conference on Solid-State Sensors and Actuators, Jun. 25-29, 1995, pp. 683-686.

Non-final Office Action dated Nov. 18, 2008 for U.S. Appl. No. 11/431,168 filed May 10, 2006. Applicant: Mehran Mehregany.

* cited by examiner

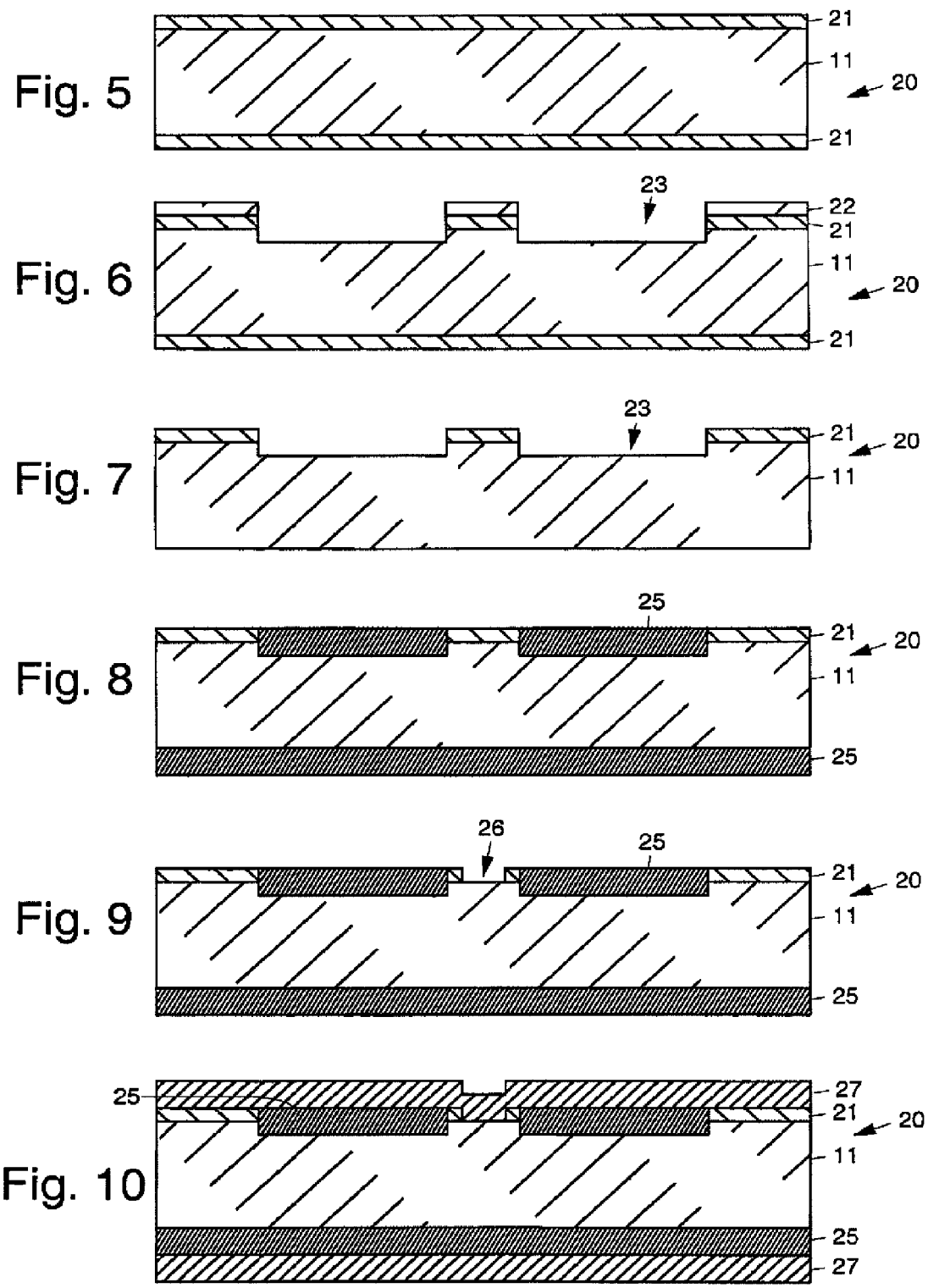

THREE-AXIS ACCELEROMETERS AND FABRICATION METHODS

RELATED APPLICATION

This application is a divisional (DIV) of U.S. patent application Ser. No. 11/431,168, entitled "THREE-AXIS ACCELEROMETERS AND FABRICATION METHODS," filed on May 10, 2006, which is herein incorporated by reference in its entirety.

BACKGROUND

The present invention relates generally to three-axis microelectromechanical systems (MEMS) accelerometers and fabrication methods relating thereto.

Three-axis accelerometers have heretofore been developed for use with motion control instrumentation, laptop computers, gaming consoles and cellular telephones, for example. Generally, such three-axis accelerometers operate based upon either piezoresistive or capacitive acceleration sensing. Capacitive three-axis accelerometers relate to the present invention and a variety of them are disclosed in various patents and publications.

A number of three-axis accelerometers have been patented by Kazuhiro Okada that use piezoresistive or capacitive acceleration sensing. U.S. Pat. No. 4,967,605 discloses a force detector that detects force using resistance elements. The force detector uses "resistance elements having the piezo resistance effect" that "are formed on a single crystal substrate to connect a strain generative body having a supporting portion and a working portion thereto to allow the resistance elements to produce a mechanical deformation on the basis of a displacement with respect to the supporting portion of the working portion, thus to electrically detect a force acting on the working portion." It is stated in U.S. Pat. No. 4,967,605 that "When a force is applied to the working portion of the force detector according to this invention, there occurs a change in the electric resistance based on mechanical deformation by piezo resistance effect, thus making it possible to electrically detect the force applied." While the force detector disclosed in U.S. Pat. No. 4,967,605 (and those disclosed by others in U.S. Pat. Nos. 5,485,749 and 6,683,358 B1 and US Patent Application No. US2005/0160814 A1) have a structure that is somewhat similar to the accelerometer disclosed herein, it is actually dissimilar, since the structure is configured to employ piezoresistive elements and is made of a number of bonded substrates.

U.S. Pat. Nos. 5,406,848 and 6,716,253 issued to Okada, and U.S. Pat. No. 5,567,880 issued to Yokota, et. al., a paper entitled "Electrostatic servo system for multi-axis accelerometers" by Jono, et. al., a paper entitled "Three-axis capacitive accelerometer with uniform axial sensitivities" by Mineta, et. al., a paper entitled "Design and processing experiments of a new miniaturized capacitive triaxial accelerometer" by Puers, et. al. and a paper entitled "Five-axis motion sensor with electrostatic drive and capacitive detection fabricated by silicon bulk micromachining" by Watanabe, et. al., for example, disclose three-axis acceleration detectors using capacitive sensing. These detectors have multiple separated substrates with electrodes disposed on them that are used to capacitively sense acceleration.

High volume three-axis accelerometer applications, in particular consumer applications, are extremely performance, cost and size sensitive. For a given set of performance requirements, cost must be reduced through minimizing chip (die) area, simplifying the fabrication process and using standard integrated circuit processes. Minimizing chip area also minimizes the lateral dimensions (i.e., width and length) of the accelerometer chip. However, there are also increasing requirements for minimizing the thickness of the chip, for example for use in very slim cell phones.

The prior art suffers from shortcomings that compromise reduction of cost and size (chip thickness and area) while meeting performance requirements. The prior art embodiments arrange the accelerometer proof mass, the suspension beams and the sense elements in such a way that one or more of the following is compromised: chip size reduction optimization, proof mass increase optimization, suspension beam compliance optimization and/or fabrication process simplification. For example, all of the design embodiments are based on substrate bonding techniques which increase the fabrication cost and chip thickness, if not also the chip area. In many of the design embodiments, the top of the proof mass and the suspension beams are arranged in the same plane, forcing compromises in increasing the proof mass, suspension beam compliance and/or chip size. In some cases where the suspension beams are place in a plane above or below the top or bottom plane of the proof mass to reduce chip area, the fabrication process is complicated and chip thickness is increased because of substrate bonding needs of the design embodiment.

It is also known to those skilled in the art that substrate bonding introduces feature alignment and structural thickness inaccuracies that are larger than those in techniques where all feature alignment is carried out on the same substrate and structural film thicknesses are determined by film deposition. As a result, substrate bonding fabrication techniques often lead to device performance variations that are larger than those resulting from single-substrate substrate fabrication processes.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIGS. 5-14 illustrate steps of an exemplary process that may be used to fabricate the three-axis MEMS accelerometer shown in FIG. 1.

DETAILED DESCRIPTION

Figure 1:
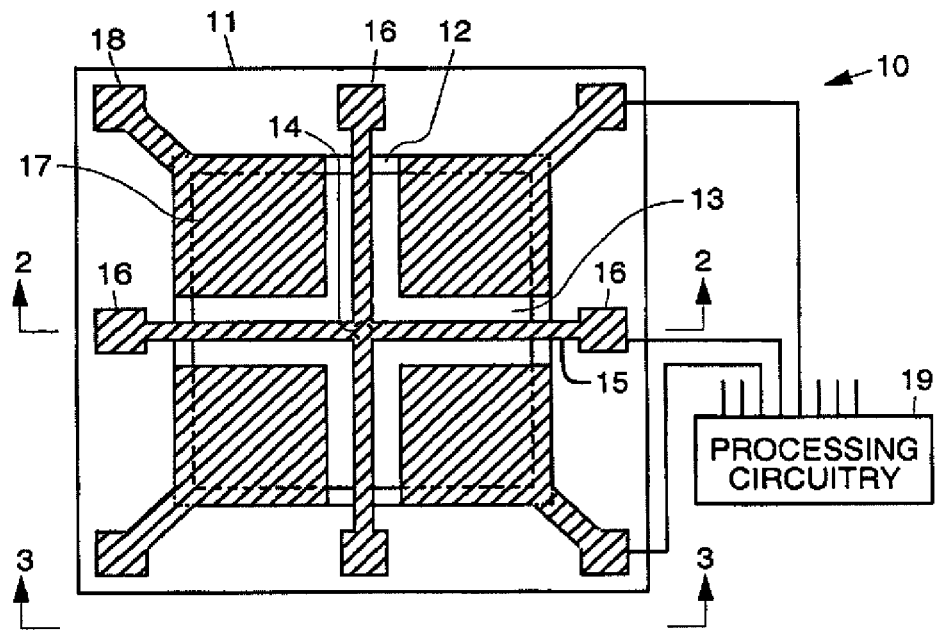
FIG. 1 is a top view of an exemplary three-axis MEMS accelerometer.
Figure 2:
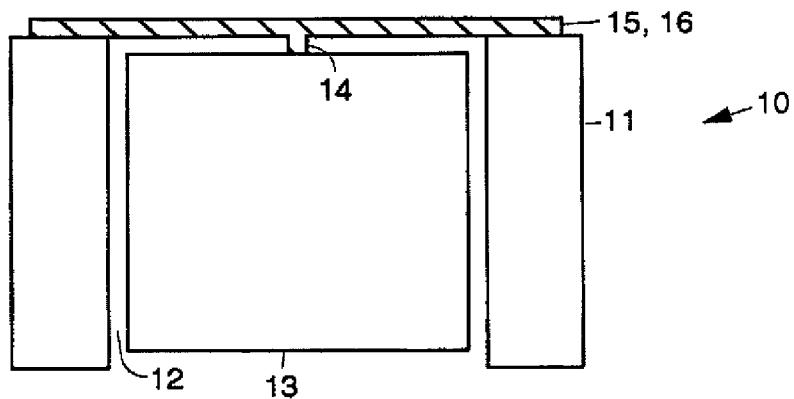
FIG. 2 is a cross-sectional view of the exemplary accelerometer shown in FIG. 1 taken along the lines 2-2.

Disclosed herein is an exemplary three-axis microelectromechanical systems (MEMS) accelerometer 10 and an exemplary method 20 for fabricating the accelerometer 10. Referring to the drawing figures, FIG. 1 is a top view of an exemplary three-axis MEMS accelerometer 10. FIG. 2 is a cross-sectional view of the exemplary accelerometer 10 taken along the lines 2-2, and FIG. 3 is a side view of the exemplary accelerometer 10 taken along the lines 3-3.

Figure 3:
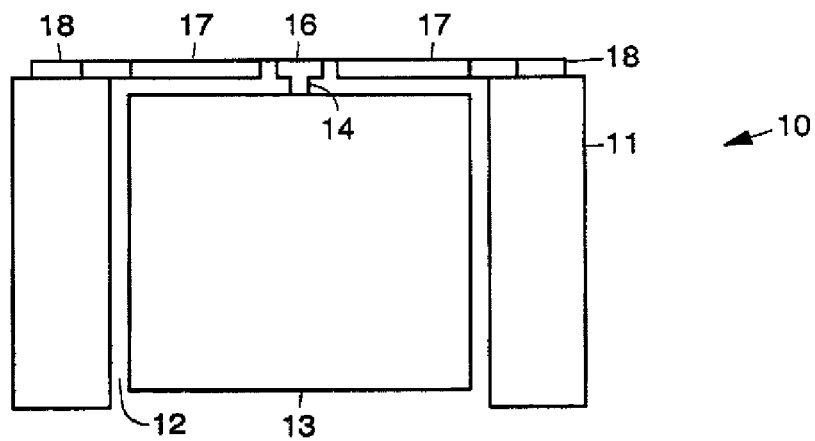
FIG. 3 is a side view of the exemplary accelerometer shown in FIG. 1 taken along the lines 3-3.

As is illustrated in FIGS. 1-3, the exemplary three-axis MEMS accelerometer 10 comprises a substrate 11, which may comprise single crystal silicon, for example. The single crystal silicon substrate 11 is preferably of very low resistivity to facilitate electrical contact and interconnection. The substrate 11 may be made from a double-sided polished, 400 μm thick silicon wafer, for example. Use of common double-sided polished silicon substrates, for example in contrast to silicon-on-insulator and bonded substrates, minimizes substrate costs.

A portion of the substrate 10 that comprises a proof mass 13 is separated from an exterior support structure by a plurality of thin etched cavities 12. An electrically-conductive anchor 14 is coupled to the top of the proof mass 13. A plurality of electrically-conductive transverse suspension arms 15 or beams 15 (that form flexural springs) extend laterally from the anchor 14 beyond the lateral edges of the proof mass 13 to the exterior support structure where they terminate at a plurality of electrodes 16 (bond pads 16). The plurality of electrically-conductive transverse suspension arms 15 and bond pads 16 may be made using surface micromachining techniques and are thus made of a structural layer that is different from that forming the proof mass 13. The proof mass 13 is preferably made using deep reactive ion etching (DRIE) of the substrate 11.

The plurality of electrically-conductive transverse suspension arms 15 or beams 15 extend along x and y axes of the accelerometer 10, while the proof mass 13 extends from the anchor 14 along the z axis of the accelerometer 10. The anchor 14, suspension arms 15 and bond pads 16 are fabricated in the same steps from the same structural layer and comprise the same material, for example low-resistivity polysilicon of the same n- or p-type as the substrate 11. Alternatively, the anchor 14, suspension arms 15 and bond pads 16 may comprise a metal, such as nickel, for example.

A plurality of sense and actuation electrodes 17 are disposed above the proof mass 13 and are separated therefrom by gaps, and extend beyond the lateral edges of the proof mass 13 to the exterior support structure where they terminate at a plurality of electrodes 18 (bond pads 18). The sense and actuation electrodes 17 and bond pads 18 are fabricated in the same steps and from the same structural layer as the suspension arms 15, bond pads 16 and anchor 14, and therefore comprise the same material. The sense and actuation electrodes 17 operate using the principle of capacitive sensing and electrostatic actuation.

Each of the sense and actuation electrodes 17 and suspension arms 15 are coupled by way of the bond pads 18, 16 to processing circuitry 19. The processing circuitry 19 is configured to process electrical signals that are sensed by electrodes 17 in response to movement of the proof mass 13. Processing of the signals derived from electrodes 17 allows determination of the acceleration components along the respective x, y and z axes of the accelerometer 10. Processing of electrical signals on electrodes 17 to actuate a movement of the proof mass 13 in the x, y and z is used for force balance operation or for self-test and self-calibration functions. This processing is well known to those skilled in the accelerometer art. It is also known to those skilled in the art that this sensing and actuation can be functionally and temporally superimposed using the same electrodes 17.

Figure 4A:
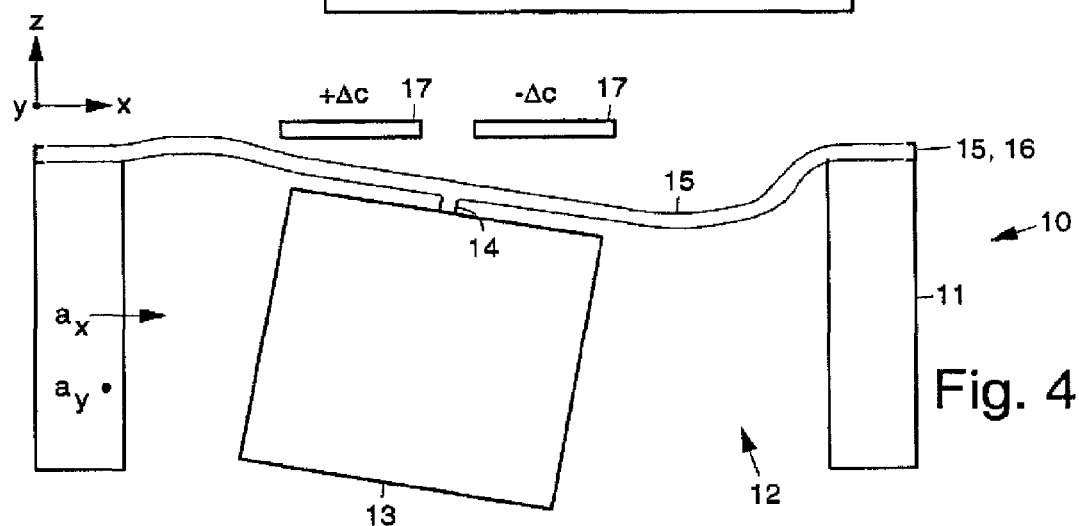
FIGS. 4a and 4b illustrate the operational principle for acceleration detection using the accelerometer.
Figure 4B:
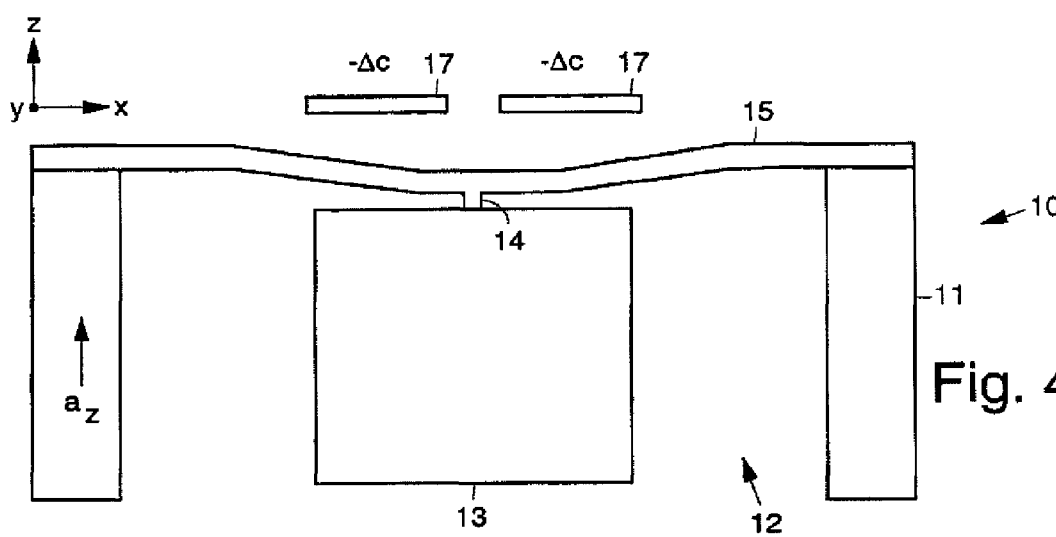

FIGS. 4a and 4b illustrate the operational principle for acceleration detection using the accelerometer 10. With regard to the accelerometer 10 shown in FIGS. 4a and 4b, the gaps between the proof mass 13 and surrounding substrate 11 are exaggerated as well as the distances between the sense electrodes 17 and the proof mass 13, the movement of the proof mass 13 and bending of the suspension arms 15. The x, y and z axes are shown at the upper left side of FIGS. 4a and 4b.

FIG. 4a illustrates x-direction (or y-direction) acceleration. The proof mass 13 moves in the x-direction (or y-direction) causing the transverse suspension arms 15 or beams 15 to bend. The respective distances between top surface of the proof mass 13 and the sense electrodes 17 change during acceleration which is capacitively sensed by the sense electrodes 17 to produce respective electrical signals. These electrical signals are processed accordingly by the processing circuitry 19 to produce x-direction (and y-direction) acceleration data. Similarly, FIG. 4b illustrates z-direction acceleration. In this case, the proof mass 13 moves closer to or away from the sense electrodes 17, which produces electrical signals that are processed by the processing circuitry 19 to produce z-direction acceleration data. With respect to force balance operation, or self-test and self-calibration, the demonstrated movement of the proof-mass 13 in FIG. 4a, for example, is induced controllably by electrostatic actuation through applying controlled voltages on the appropriate electrodes. This controllably induced movement is then sensed as described above, closing the control loop for force balance operation, or self-test and self-calibration.

It should be clear to those skilled in the art that the x-y axes orientation may be rotated in the x-y plane for variations in orientations, geometries and locations of the suspension arms 15, electrodes 17 and bond pads 16, 18. For example, a 45 degree clockwise or counter clockwise rotation of the x-y axes in the x-y plane could have the suspension arms 15 extending over the lateral diagonals of the proof mass 13 and the electrodes 17 extending from the substrate 11 over the lateral center lines of the proof mass 13, wherein the electrodes 17 have triangular geometries with bases at the substrate 11 and apexes toward the anchor 14. In some cases, the suspension beams 15 may be modified, for example, to folded, perforated and slotted beams (and combinations thereof), to adjust the compliance of the suspension beams 15, reduce the effect of squeeze film damping on the proof mass 13 movement speed and mitigate the effect of residual stresses from the suspension beams 15 structural layer material. In some cases, electrodes 17 may be further partitioned, and their geometries and locations varied, for more flexibility and functionality in sensing and actuation. Furthermore, perforations and/or slots maybe incorporated in the electrodes 17 to reduce the effect of squeeze film damping on the proof mass 13 movement speed and mitigate the effect of residual stresses from the electrodes 17 structural layer material. Such perforations and slots in the electrodes 17 may be optimized to minimize any resulting degradation in the mechanical stiffness and electrical performance of electrodes 17. These concepts and techniques are generally known and their utility should be clear to those skilled in the art.

Figure 1A:
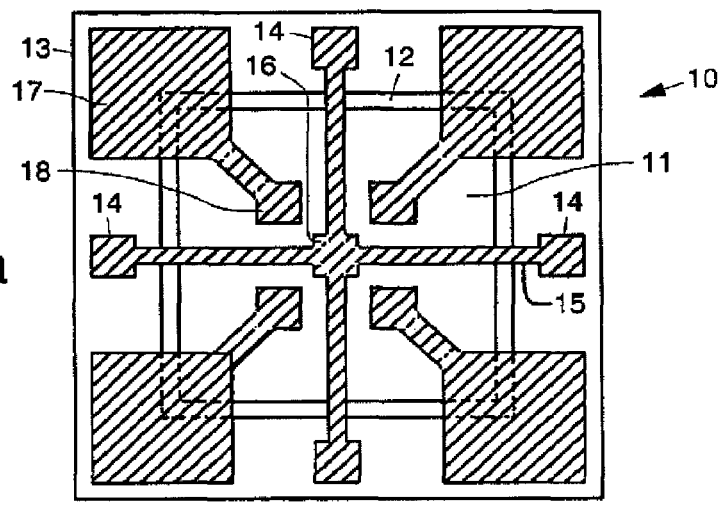
FIG. 1a is a top view of an alternative embodiment of the three-axis MEMS accelerometer.

Possible embodiment variations of the exemplary accelerometer 10 should also be clear to those skilled in the art. For example, an inside-out version (i.e., in the x-y plane), illustrated in FIG. 1a, would have the proof mass 13 symmetrically surrounding the interior substrate 11. Electrically-conductive anchors 14 would be coupled to the top of the proof mass 13. A plurality of electrically-conductive transverse suspension arms 15 extend laterally from the anchors 14 beyond the lateral inside edges of the proof mass 13 to the interior support structure where they terminate at bond pad 16. The sense and actuation electrodes 17 would then be anchored to the interior substrate 11 and extend out onto the proof mass 13 surrounding the substrate 11. Another variation may comprise a combination of the exemplary accelerometer 10 and the foregoing inside-out version, wherein the proof mass 13 as originally surrounded by the substrate 11 also surrounds an interior portion of the substrate 11 as in the inside-out version. The suspension beams 15 would be arranged and anchored as in the inside-out version in FIG. 1a, while the sense and actuation electrodes 17 would be arranged and anchored as in the exemplary accelerometer 10 of FIG. 1. Bond pads 16, 18 would be located correspondingly.

FIGS. 5-14 illustrate steps of an exemplary process 20 or method 20 that may be used to fabricate an exemplary three-axis MEMS accelerometer 10, such as is shown in FIG. 1. The exemplary fabrication process 20 or method 20 may be implemented as follows.

As is shown in FIG. 5, a nitride electrical isolation layer 21 is deposited on both sides of a silicon substrate 11. The nitride isolation layer 21 may be on the order of 2500 Angstroms thick. As shown in FIG. 6, the nitride isolation layer 21 on the front surface of the substrate 11 is patterned using photoresist 22 to define areas in which cavities 23 are formed that subsequently allow release of the proof mass 13. These shallow cavities 23 are etched into the silicon substrate 11 using the nitride isolation layer 21 and photoresist 22 as a mask. The cavities 23 are on the order of 1 μm deep. Although not shown, cavities 23 may also be incorporated under the bond pads 18 and electrical interconnects between electrodes 17 and bond pads 18 to reduce the parasitic capacitances associated with the substrate 11 as further described below. The back side nitride isolation layer 21 is removed after the cavities 23 are etched into the silicon substrate 11, followed by the removal of the photoresist 22 as is shown in FIG. 7.

As is shown in FIG. 8, the silicon substrate 11 is thermally oxidized to form a sacrificial oxide layer 25 that fills the cavities 23 by local oxidation of silicon to form a generally planar top surface. A sacrificial oxide layer 25 is also formed on the back side of the substrate 11 in the same step. The sacrificial oxide layer 25 that is formed may be on the order of 2 μm thick. Although not shown, the sacrificial oxide layer 25 would also fill those cavities 23 that may have been incorporated under the bond pads 18 and electrical interconnects between electrodes 17 and bond pads 18 to reduce the parasitic capacitances associated with the substrate 11. A blanket dry etch using reactive ion etching of the top side of the structure is performed to remove any oxide that may have been grown on the nitride isolation layer 21.

As is shown in FIG. 9, an anchor hole 26 is etched through the nitride isolation layer 21 to expose the underlying silicon substrate 11. In this same step, the nitride under the bond pads 16 may also be patterned to expose the underlying silicon substrate 11 if electrical connection of the proof mass 13 to the substrate 11 through the electrically-conductive suspension anus 15 is desired.

Figure 11:
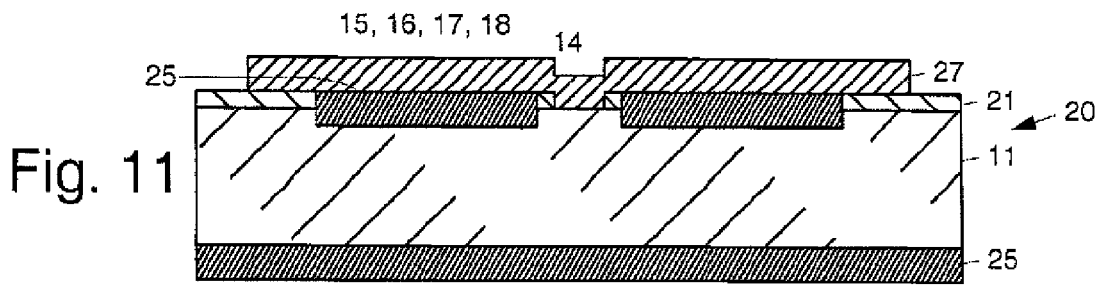

As is shown in FIG. 10, a low-resistivity polysilicon layer 27 is deposited which coats the top and bottom sides of the structure and fills the anchor hole 26, forming the electrically-conductive anchor 14. Referring to FIG. 11, the polysilicon layer 27 on the front side of the structure is patterned to define the suspension arms 15, sense and actuation electrodes 17, and bond pads 16, 18, and the back side polysilicon layer 27 is removed. Although not shown, in this step, the edges of the bond pads 18 and electrical interconnects between electrodes 17 and bond pads 18 are patterned beyond the edges of those cavities 23 that may have been incorporated under them to reduce the parasitic capacitances associated with the substrate 11. As a result, along the entire periphery of those cavities 23, the polysilicon layer 27 directly contacts the nitride electrical isolation layer 21, sealing the oxide sacrificial layer 25 inside those cavities 23 from being etched when the proof mass 13 is subsequently released. Because the sacrificial oxide layer 25 is thicker than the nitride isolation layer 21 and also has a lower permittivity, the substrate parasitic capacitances associated with bond pads 18 and electrical interconnects between electrodes 17 and bond pads 18 are substantially reduced by this technique without adding fabrication process steps to accomplish the same. As known by those skilled in the art, reducing these substrate parasitic capacitances enhances sensor performance.

Figure 12:
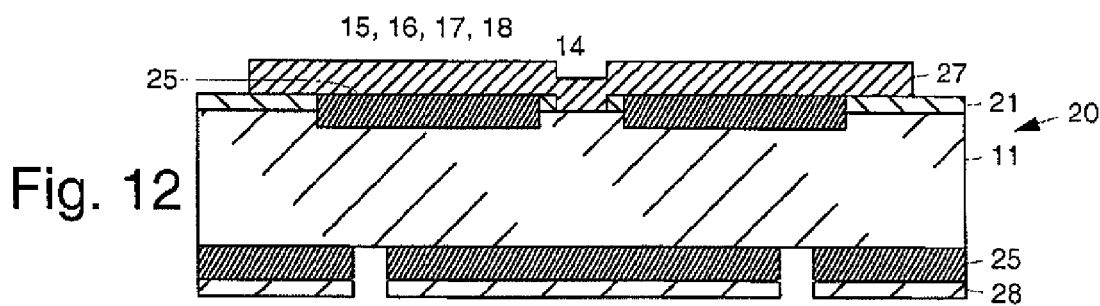

As is shown in FIG. 12, the sacrificial oxide layer 25 on the back side of the structure is patterned using a mask layer 28 to define the thin etched cavities 12 for forming the proof mass 13 and provide "auto-dicing" lines. The latter removes risk of damage to the micromechanical structures during traditional dicing using a saw as well as eliminating this cost.

Figure 13:
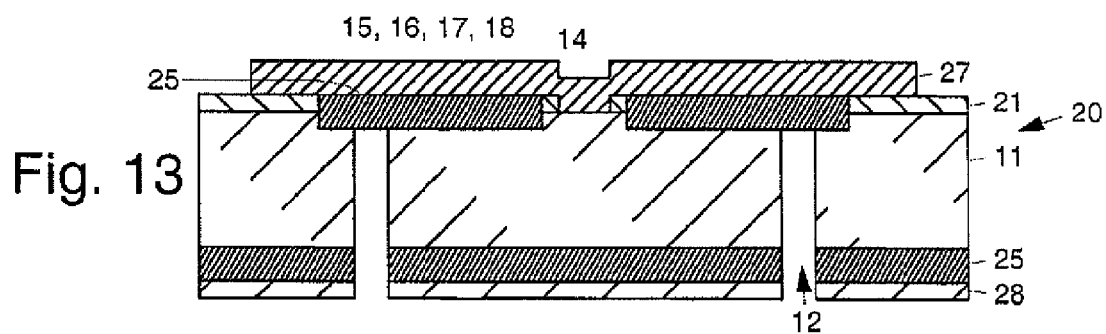

As is shown in FIG. 13, a deep reactive ion etch is performed to etch through the back side of the silicon substrate 11 to expose the sacrificial oxide layer 25 disposed beneath the polysilicon layer 27 on the front side of the structure. The deep reactive ion etch defines the outer edge of proof mass 13.

Figure 14:
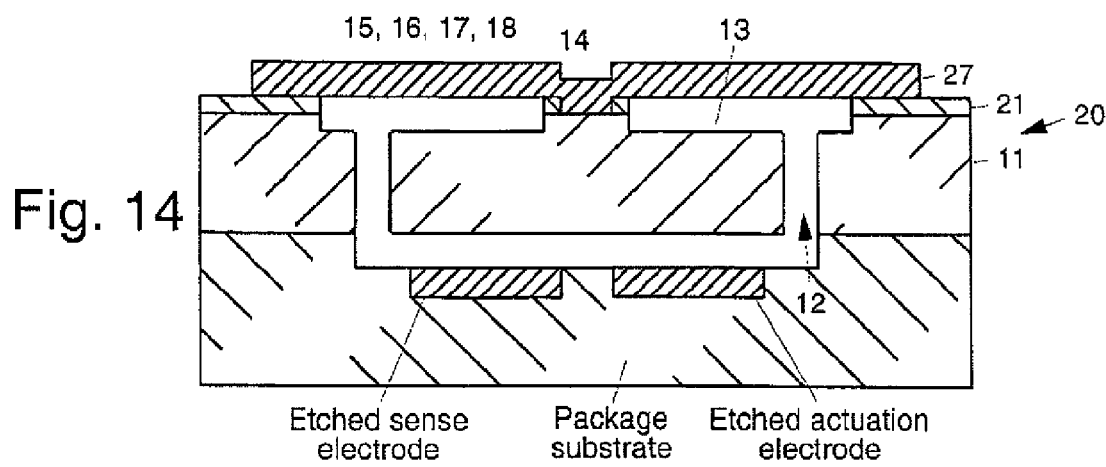

As is shown in FIG. 14, the proof mass 13 is released from the surrounding silicon substrate 11 and polysilicon layer 27 (suspension beams 15 and sense and actuation electrodes 17) by dissolving the sacrificial oxide layer 25. This finalizes fabrication of the accelerometer 10.

After fabrication, the accelerometer 10 is typically mounted on a packaging substrate. In order to not obstruct the movement of the proof mass 13 by the mating surface of the packaging substrate, a provision is made to recess the proof mass 13 slightly (e.g., 2 μm) from the mating surface of the packaging substrate. Thus, the packaging substrate will have a cavity in it to allow separation of the proof mass 13. If this cavity is not provided in the packaging substrate, then an additional pattern/etch step on the back side of the substrate 11 is needed, which may be performed between the steps shown in FIGS. 7 and 8, to create the recess in the substrate 11 on the bottom side where the proof mass 13 will reside. In this case, the proof mass 13 is recessed from the bottom surface of substrate 11 surrounding it. Regardless, the packaging substrate may also incorporate sensing and actuation electrodes under the proof mass 13, within the cavity, for detection and actuation of the proof mass 13 movement.

It should be clear to those skilled in the art that the steps shown and described with reference to FIGS. 12 and 13 may be used to also pattern the substrate 11 into physically (and therefore electrically) separate regions anchoring suspension beams 15/bond pads 16, supporting sense and actuation electrodes 17/bond pads 18 and also implementing vertical sense and actuation electrodes from columnar features etched into the substrate 11 and separated from the proof mass 13 by thin etched cavities 12.

The three-axis microelectromechanical systems (MEMS) accelerometer 10 disclosed above has a number of features that distinguish it from the prior art. The disclosed embodiment eliminates the need for wafer bonding in realizing the proof mass 13, suspension arms 15, sense/actuation electrodes 17 and anchor 14. This leads to process simplification and chip size reduction (importantly, including chip thickness).

The anchor 14, suspension arms 15, sense/actuation electrodes 17 and bond pads 16, 18 are made simultaneously from the same electrically-conductive (i.e., low-resistivity polysilicon) material, which also provides the necessary electrical contact and interconnect provisions for the sensor. Within the real estate required for the proof mass 13 size, the suspension arms 15, sense/actuation electrodes 17 and anchor 14 are implemented, eliminating real estate overhead for the same.

The single-substrate design allows for accurate feature alignment, eliminating the related sensitivity imbalances of the proof mass 13 and suspension arms 15 otherwise resulting from such alignment inaccuracies, for example in substrate bonding approaches. The overall design based on a single substrate 11 is more compatible with integrated circuit fabrication processing and therefore less costly in manufacturing. It also lends itself to integration of the sensor with the necessary interface electronics 19 on the same substrate 11, when doing so is desired.

The thickness of the suspension arms 15 is determined by film deposition, which can be controlled accurately in manufacturing, minimizing variations of compliance of the suspension arms 15 (and therefore sensor mechanical element sensitivity). The surface micromachining enabled embodiment allows anchor 14 to be very small, approximating a pivot point in order to enhance the sensitivity of the mechanical structure to acceleration, reducing the required sensor size. Once affixed to a package substrate from the bottom side of sensor substrate 11, movement of the proof mass 13 is constrained on all its sides, enabling good mechanical stop against undesirable shock.

Deep reactive ion etching enables separating the proof mass 13 from the substrate 11 with thin etched cavities 12 that are utilized for shock protection and also enable real estate efficiency. The local oxidation of silicon technique, to create the sacrificial oxide layer and a generally planar surface, eliminates surface topography to allow for high quality pattern definition of the suspension arms 15 and sense/actuation electrodes 17, i.e., elements whose geometry is critical to the device performance. It also eliminates steps where these elements are anchored to the proof mass 13 and substrate 11 (as applicable). It is known in the art that these steps are weak mechanical points of premature failure, but are often inherent to the design and fabrication processes that have been employed.

Thus, three-axis accelerometers and fabrication methods relating thereto have been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. A method of fabricating an accelerometer, comprising:
providing a substrate;
forming an isolation layer on the substrate;
patterning the isolation layer disposed on the front side of the substrate;
removing the back side isolation layer when necessary;
forming a sacrificial layer on the substrate;
removing the sacrificial layer on the isolation layer;
etching anchor holes and bond pad contact windows through the isolation layer to expose the underlying substrate;
forming a low-resistivity structural layer on the substrate;
patterning the low-resistivity structural layer on the front side of the structure to define suspension arms, sense and actuation electrodes, and bond pads;
removing the back side low-resistivity layer when necessary;
patterning the sacrificial layer on the back side of the substrate if such is formed;
etching the back side of the substrate to expose the sacrificial layer disposed beneath the low-resistivity structural layer on the front side of the substrate and to define outer edge of a proof mass; and
releasing the proof mass by dissolving the sacrificial layer.

2. A method of fabricating an accelerometer, comprising;
providing a substrate;
forming an isolation layer on the substrate;
patterning the isolation layer disposed on the front side of the substrate;
etching cavities into the substrate where the isolation layer is patterned;
removing the back side isolation layer when necessary;
forming a sacrificial layer on the substrate that fills the cavities on the front side of the substrate;
removing the sacrificial layer on the isolation layer;
etching anchor holes and bond pad contact windows through the isolation layer to expose the underlying substrate;
forming a low-resistivity structural layer on the substrate;
patterning the low-resistivity structural layer on the front side of the structure to define suspension arms, sense and actuation electrodes, and bond pads;
removing the back side low-resistivity layer when necessary;
patterning the sacrificial layer on the back side of the substrate if such is formed;
etching the back side of the substrate to expose the sacrificial layer disposed beneath the low-resistivity structural layer on the front side of the substrate and to define outer edge of a proof mass; and
releasing the proof mass by dissolving the sacrificial layer.

3. The method recited in claim 2 wherein the sacrificial layer comprises oxide, and etching the back side of the substrate comprises dry reactive ion etching.

4. The method recited in claim 2 wherein the substrate comprises a semiconductor substrate.

5. The method recited in claim 2 wherein the substrate comprises a silicon substrate.

6. The method recited in claim 2 wherein the substrate comprises a semiconductor-on-insulator substrate.

7. The method recited in claim 2 wherein the substrate comprises a metal in which deep trenches may be fabricated by reactive ion etching.

8. The method recited in claim 2 wherein the structural layer comprises a semiconductor layer.

9. The method recited in claim 2 wherein the structural layer comprises doped polysilicon.

10. The method recited in claim 2 wherein the structural layer comprises metal.

* * * * *